(12) United States Patent
Shabtay et al.

(10) Patent No.: US 11,627,684 B2
(45) Date of Patent: Apr. 11, 2023

(54) BI-DIRECTIONAL FAN

(71) Applicant: Mellanox Technologies, Ltd., Yokneam (IL)

(72) Inventors: Ayal Shabtay, Haifa (IL); Shay Zaretsky, Qiryat Mozkin (IL); Yogev Buzaglo, Kiryat ata (IL)

(73) Assignee: Mellanox Technologies, Ltd., Yokneam (IL)

( * ) Notice: Subject to any disclaimer, the term of this patent is extended or adjusted under 35 U.S.C. 154(b) by 138 days.

(21) Appl. No.: 16/810,248

(22) Filed: Mar. 5, 2020

(65) Prior Publication Data

US 2021/0282296 A1 Sep. 9, 2021

(51) Int. Cl.
*H05K 7/20* (2006.01)
*F04D 29/64* (2006.01)
*H01R 25/00* (2006.01)
*F04D 29/70* (2006.01)

(52) U.S. Cl.
CPC ....... *H05K 7/20172* (2013.01); *F04D 29/646* (2013.01); *F04D 29/703* (2013.01); *H01R 25/006* (2013.01)

(58) Field of Classification Search
None
See application file for complete search history.

(56) References Cited

U.S. PATENT DOCUMENTS

| 8,508,941 B2 * | 8/2013 | Simon | H05K 7/20581 361/695 |
| 2004/0190246 A1 * | 9/2004 | Arbogast | H05K 7/20172 361/695 |

* cited by examiner

*Primary Examiner* — Juan G Flores
(74) *Attorney, Agent, or Firm* — Moore & Van Allen PLLC; Michael M. McCraw

(57) ABSTRACT

A bi-directional fan device that is field replaceable within an electronic system is provided. The bi-directional fan device includes a fan unit that cools an electronic system when connected to a power source, and an electrical connector constructed at both ends of the fan unit to electrically connect to the power source.

20 Claims, 5 Drawing Sheets

BI-DIRECTIONAL FAN

FIELD OF THE INVENTION

The invention relates to the field of field replacement units (FRU). In particular, to a complementary attachment that assembles on to an FRU switch fan in order to enable an air flow towards or away from an electronic system to regulate temperature.

BACKGROUND OF THE INVENTION

Temperature regulation for electronic systems serves an important role for maintaining high efficiency in those systems. As used herein, "electronic system" is used interchangeably with "system" and refers to any electronic system that requires temperature regulation by monitoring and subsequent cooling, e.g., a switch box for an electronic switch system. Guided airflow may be used to cool a system directly by flowing cool air on to the target system or by heat extraction away from the system by ventilation. Currently, however, two separate fan-units are normally used for each purpose: one to flow air into the system and one to extract hot air out. Since both methods of cooling are needed, two separate inflow or outflow fan units are regularly exchanged to achieve optimal cooling. As such, fan units have a permanent connector on one side, to allow inserting the uni-directional fan in that one direction as required by the system's configuration.

It is an objective of the present invention to provide a fan device that is capable of serving as an airflow inlet or outlet interchangeably in accordance with an electronic system configuration.

It is another objective of the present invention to reduce the number of active fan units on stock and reduce lead time for such components.

Other advantages and objectives of the invention will become apparent as the description proceeds.

SUMMARY OF THE INVENTION

The present invention uses a single versatile removable chassis that assembles on to a fan unit. The removable chassis may be clipped on to the fan unit at either end so that the fan unit may serve as an airflow inlet or outlet interchangeably in accordance with the system configuration.

The present invention relates to a bi-directional fan device which is field replaceable within an electronic system, comprising:
  a fan unit configured to cool an electronic system when connected to a power source; and
  an electrical connector constructed at both ends of the fan unit to electrically connect to the power source.

According to an embodiment of the invention, the electrical connectors may be located at any position at either end of the fan unit.

According to an embodiment of the invention, the fan unit may be any size. For example, the fan units may be 40×40, 60×60 and 80×80 cm.

According to an embodiment of the invention, a removable chassis is adapted to be assembled at either end of the fan unit, thereby enabling to connect said fan to the electronic system to allow airflow towards or away from the electronic system.

According to an embodiment of the invention, the electrical connectors may be located at any position at either end of the fan unit.

According to an embodiment of the invention, the removable chassis comprises a structure that allows air to flow through it and the fan unit.

According to an embodiment of the invention, the removable chassis may comprise a handle.

According to an embodiment of the invention, the removable chassis further comprises a mechanism to secure it to the fan unit.

According to an embodiment of the invention, the removable chassis further comprises a visual indication of the direction of the airflow.

DETAILED DESCRIPTION OF THE INVENTION

Throughout this description the term "electronic system" is used to indicate a system that may have multiple field replaceable fan devices, by way of example only, such as rack mount equipment. However, this term does not imply any specific type of electronic system; the invention is applicable with all suitable equipment that may use a field replaceable fan. For example, the electronic system is capable of being implemented in standalone configurations, in custom frames with other electronic components, in half or full height electronic cabinets, and so on.

Reference will now be made to several embodiments of the present invention, examples of which are illustrated in the accompanying figures. Wherever practicable, similar or identical reference numbers may be used in the figures and may indicate similar or identical functionality. The figures depict embodiments of the present invention for purposes of illustration only. One skilled in the art will readily recognize from the following description that alternative embodiments of the structures illustrated herein may be employed without departing from the principles of the invention described herein.

The basic principle of the present invention applies to fan units of any size. Although, fan units may be the size 40×40, 60×60 and 80×80 cm, the basic principle of having more than one electrical connector, and that they are located at either end of the bi-directional fan unit, remains the same.

Figure 1:
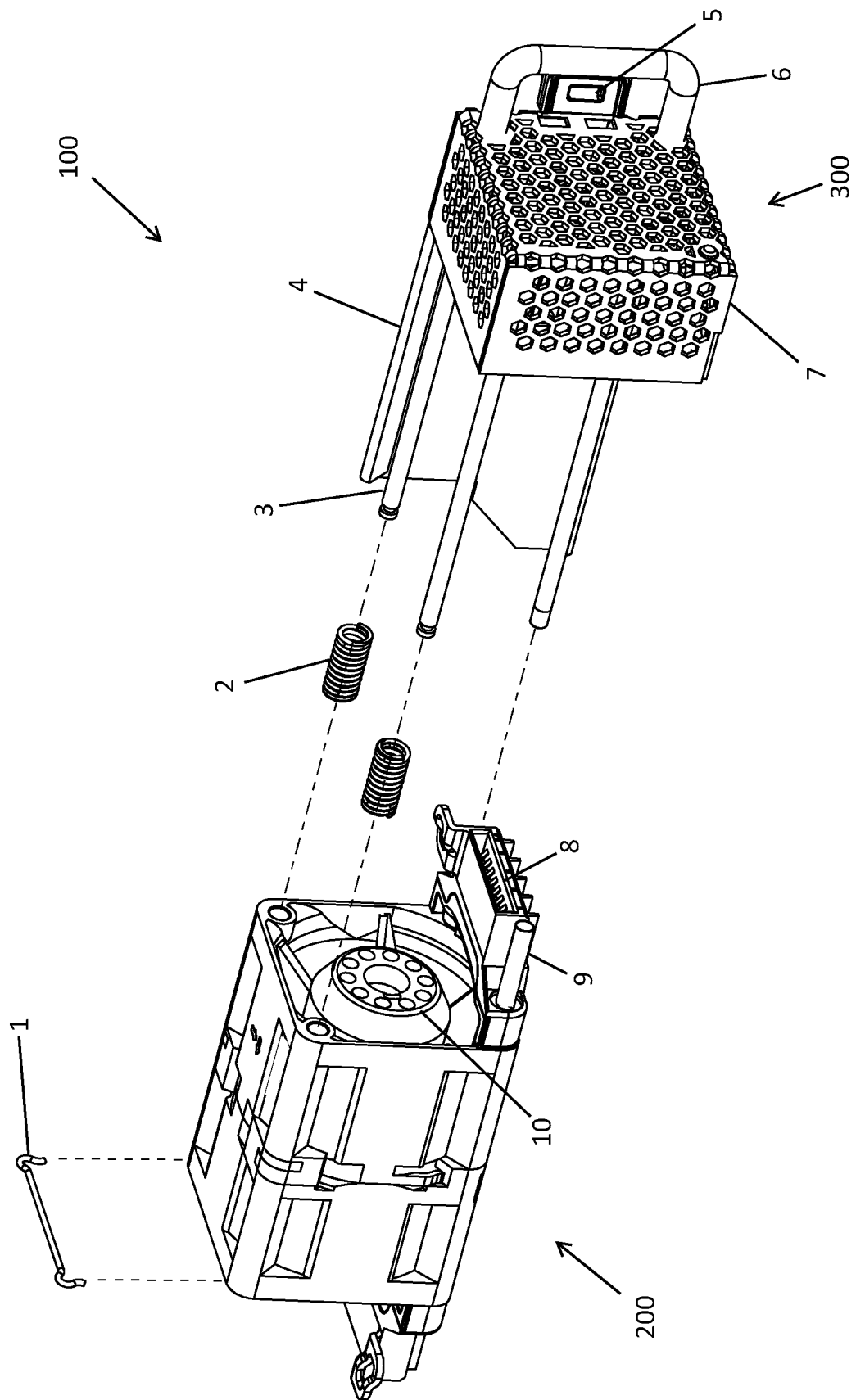
FIG. 1 schematically illustrates a fan unit alongside a chassis connector mount before it is secured in place, according to an embodiment of the present invention.
Figure 2:
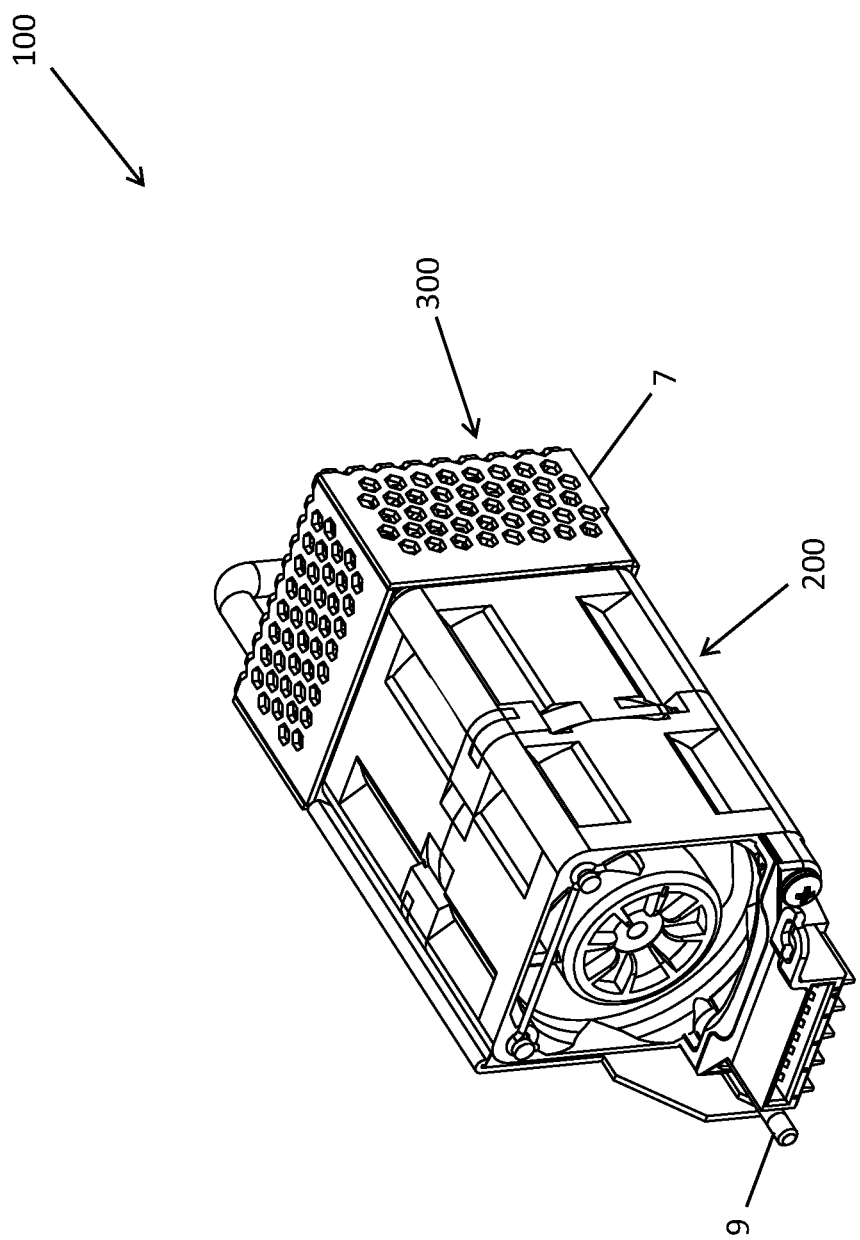
FIG. 2 schematically illustrates the fan unit of FIG. 1 provided with the chassis assembled to allow airflow in one direction away from an electronic system.
Figure 3:
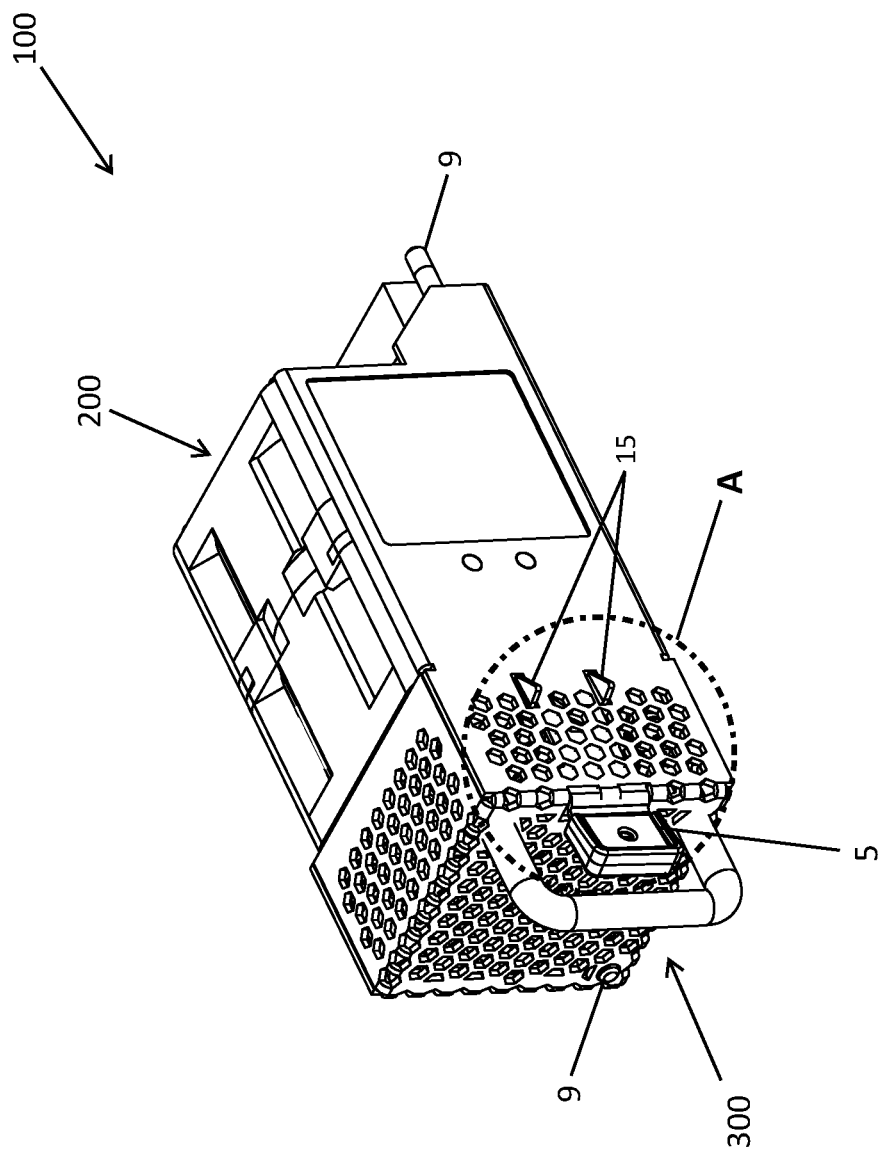
FIG. 3 schematically illustrates the fan unit of FIG. 1 provided with the chassis assembled to allow airflow in the opposite direction of FIG. 2, i.e., towards the electronic system.

FIG. 1 schematically illustrates a bi-directional fan device (100), which shows an unassembled fan unit (200) with removable chassis (300), including dotted lines to indicate how the fan unit (200) is assembled with the chassis (300). The chassis (300) may be assembled on to the fan unit (200)

to enable airflow away from (see FIG. 2) or towards (see FIG. 3) an electronic system (not shown).

The bi-directional fan device (100) comprises a fan unit (200) that is built to blow air in one direction, a chassis (300) with handle (6) which is guided with pins (3) to go through holes through the full body (200) of the fan unit. The chassis itself is made with a side-panel (4) that may be guided along corresponding runners on the fan unit for easy assembly. The chassis also includes a cage (7) that allows airflow through it in either direction. The cage may take on any design that allows airflow through it e.g., holes, slats or a permeable sheet. Once through the body of the fan unit, the pins are secured by a wire clip (1) on the opposite end of the fan unit. The wire clip may be embodied by any non-permanent securing mechanisms such as a clasp, screw or clip. Springs (2) are sheathed along the pins as dampeners to reduce damage to the fan unit and chassis. A securing mechanism for connecting the chassis to the fan unit may be located on the side panel of the chassis. For example, the securing mechanism may be a spring loaded clip (depicted in the schematic illustration shown in FIG. 3 with label 'A' indicating the clip's head (5) and retractable anchors (15)) located on the side-panel of the chassis which secures the chassis (300) in place to fully engage the fan unit (200). In this example, the anchors (15) maintain the engagement of the chassis (300) to the fan unit (200), and in order to release the chassis (300) from the fan unit (200), one may temporary cause retraction of the retractable anchors (15), e.g., applying force on the clip's head (5).

Figure 4:
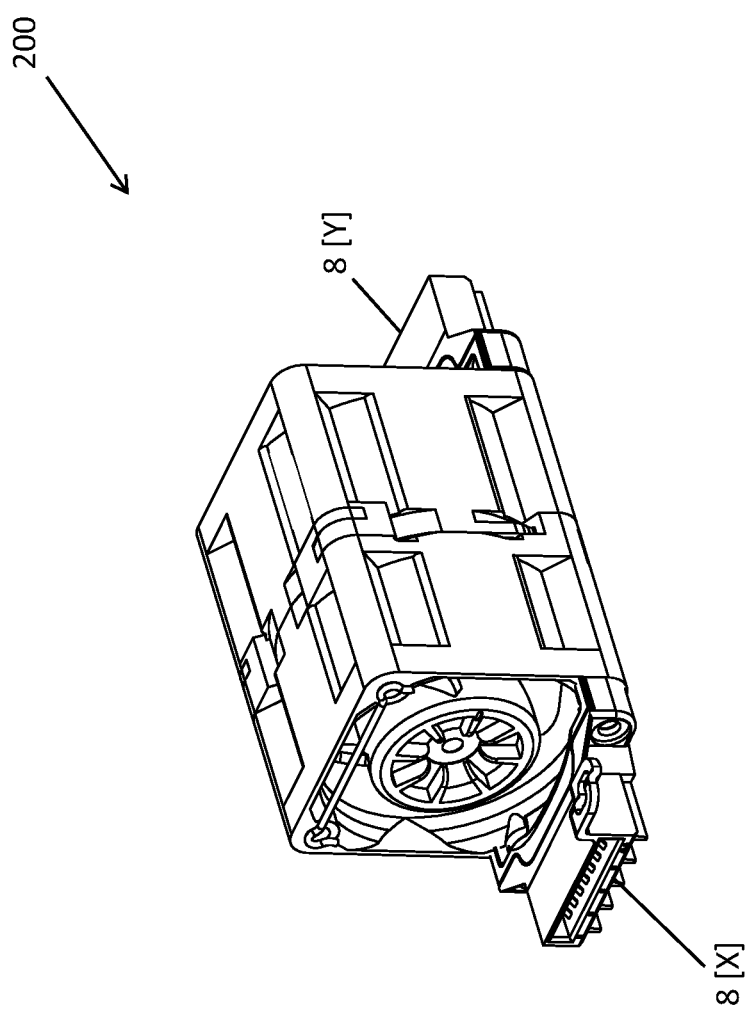
FIG. 4 schematically illustrates the fan unit (without the chassis) with electrical connectors at both ends of the fan unit, in the same position.
Figure 5:
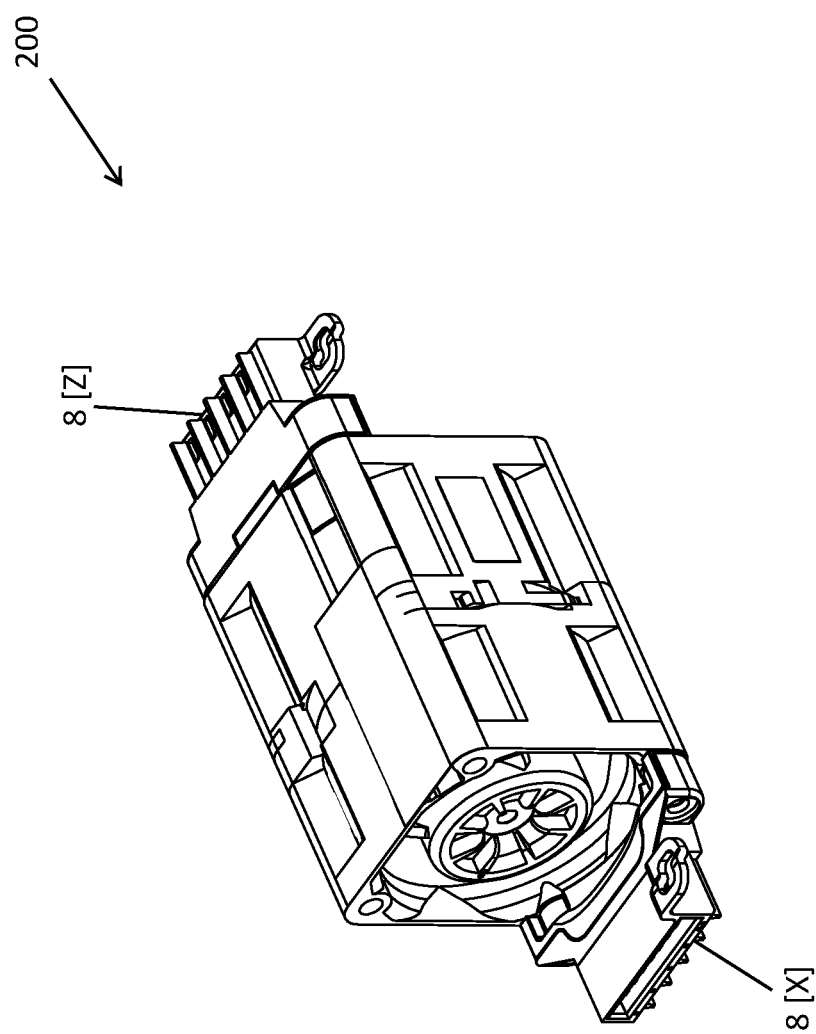
FIG. 5 schematically illustrates the fan unit (without the chassis) with electrical connectors at both ends of the fan unit, but in different positions.

An electrical connector (8) is situated at either end of the fan unit to provide electrical access regardless of which end the chassis is secured on to. The electrical connector comprises a set of electrical contacts and it may be located in the same position but on either sides of the fan unit (see FIG. 4), or in different positions (see FIG. 5) according to the configuration of the electronic system. An example of the positioning of the electrical connectors may be seen in the schematic illustrations FIG. 4 and FIG. 5 which show two possible position combinations (X and Y) and (X and Z) that the electronic connector (8) may be located.

According to an embodiment of the invention, the fan device (100) connects to a circuit board edge portion of an electronic circuitry of the electronic system. Typically, the electrical connector (8) may include a connector body and a set of metallic contacts. For example, the connector body may define a set of recesses, connector walls and a ramp (not shown). In many existing fan devices, an inner chamber of the electrical connector (8) is usually sized to define the set of recesses for holding the set of electrical contacts, as well as to provide added depth to support and protect wire-end portions which mate with the set of electrical contacts. In some arrangements, the set of electrical contacts fasten to the wire-end portions in a crimp-style manner.

Once assembled, electric access is only available on the end opposite to where the chassis is assembled. Once the chassis is secured, a visual indication such as a colored pin (9) is visible from the chassis cage (7) to indicate which direction the fan unit is operating in. For example, on one side the colored pin is blue, indicating airflow in the forward direction i.e., towards the system, to directly cool the system. On the other side of the fan unit the colored pin is red, indicating airflow in the backwards direction i.e., away from the system to extract the hot air (ventilate) surrounding the system.

The removable chassis may thus be assembled at either end of the fan unit to facilitate bi-directional airflow according to the requirements of the electronic system.

The fan device of the present invention is capable of being used in a variety of applications. Such a fan device enables the manufacturer to re-use the fan device in different applications either to cool a system directly by drawing air through the removable chassis and exhausting the air out a back of the chassis (i.e., flowing cool air on to a target system) or by heat extraction away from the system by ventilation, all with little or no re-design.

While various embodiments of the invention have been particularly shown and described, it will be understood by those skilled in the art that various changes in form and details may be made therein without departing from the spirit and scope of the invention as defined by the appended claims.

For example, the fan devices of the present invention were described above either as drawing air through an electronic system and exhausting the air out of that electronic system (i.e., away from the electronic system), or as blowing air into the electronic system in the opposite direction to provide cooling to the electronic system, by way of example only. In other arrangements, the fan device may reside at the front of an enclosure so that the warmed air is exhausted out of the rear of the enclosure and generally away from any equipment operators or technicians.

Additionally, it should be understood that the electrical connectors of the fan device were shown as having contacts on only one location at each side by way of example only. In other arrangements, the electrical connectors may have contacts on multiple locations at each side, e.g., upper and lower contacts at each side, to provide additional electrical access connectors. Such modifications and enhancements are intended to belong to various embodiments of the invention.

The invention claimed is:

1. A bi-directional fan device comprising:
a fan unit configured to direct air via a body of the fan unit in a first direction;
a first electrical connector positioned at a first end of the body of the fan unit, wherein the first electrical connector is configured to electrically connect the fan unit to a power source in a first configuration; and
a second electrical connector positioned at a second end of the body of the fan unit opposite the first end, wherein the second electrical connector is configured to electrically connect the fan unit to the power source in a second configuration; and
a removable chassis, wherein, in the second configuration, the removable chassis is removably attached to the first end of the fan body and configured to prevent electrical connection with the first electrical connector.

2. The bi-directional fan device according to claim 1, wherein at least a portion of the removable chassis is configured to allow air to pass therethrough.

3. The bi-directional fan device according to claim 1, wherein the removable chassis further comprises a handle.

4. The bi-directional fan device according to claim 1, wherein the removable chassis further comprises a mechanism configured to removably secure the chassis to the body of the fan unit.

5. The bi-directional fan device according to claim 1, wherein the removable chassis further comprises a mechanism for providing a visual indication of the first direction in which air is directed by the fan unit.

6. The bi-directional fan device according to claim 5, wherein the mechanism for providing the visual indication further comprises a colored pin.

7. The bi-directional fan device according to claim 1, wherein the fan unit is configured to draw air through the removable chassis from the fan unit.

8. The bi-directional fan device according to claim 1, wherein the fan unit is configured to direct air from the fan unit toward the removable chassis.

9. The bi-directional fan device according to claim 1, wherein the body of the fan unit defines one or more holes configured to receive corresponding pins of the removable chassis.

10. The bi-directional fan device according to claim 9, further comprising one or more springs sheathed along the corresponding pins of the removable chassis.

11. The bi-directional fan device according to claim 1, wherein the first electrical connector and the second electrical connector are co-planar.

12. The bi-directional fan device according to claim 1, wherein the first electrical connector is positioned in a plane that is substantially parallel with respect to a plane defined by the second electrical connector.

13. The bi-directional fan device according to claim 1, wherein each of the first electrical connector and the second electrical connector defines a plurality of metallic contacts.

14. The bi-directional fan device according to claim 1, wherein the removable chassis further comprises one or more anchors configured to maintain engagement between the fan unit and the removable chassis.

15. A bi-directional fan device comprising:
a fan unit configured to direct air via a body of the fan unit in a first direction;
a first electrical connector positioned at a first end of the body of the fan unit, wherein the first electrical connector is configured to electrically connect the fan unit to a power source in a first configuration; and
a second electrical connector positioned at a second end of the body of the fan unit opposite the first end, wherein the second electrical connector is configured to electrically connect the fan unit to the power source in a second configuration; and
a removable chassis, wherein, in the first configuration, the removable chassis is removably attached to the second end of the fan body and configured to prevent electrical connection with the second electrical connector.

16. The bi-directional fan device according to claim 15, wherein at least a portion of the removable chassis is configured to allow air to pass therethrough.

17. The bi-directional fan device according to claim 15, wherein the removable chassis further comprises a handle.

18. The bi-directional fan device according to claim 15, wherein the removable chassis further comprises a mechanism configured to removably secure the chassis to the body of the fan unit.

19. The bi-directional fan device according to claim 15, wherein the removable chassis further comprises a mechanism for providing a visual indication of the first direction in which air is directed by the fan unit.

20. The bi-directional fan device according to claim 19, wherein the mechanism for providing the visual indication further comprises a colored pin.

* * * * *